(12) United States Patent
Biber

(10) Patent No.: US 11,698,425 B2
(45) Date of Patent: Jul. 11, 2023

(54) MAGNETIC RESONANCE DEVICE

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/693,061

(22) Filed: Mar. 11, 2022

(65) Prior Publication Data

US 2022/0291313 A1 Sep. 15, 2022

(30) Foreign Application Priority Data

Mar. 11, 2021 (DE) .................... 10 2021 202 389.4

(51) Int. Cl.
*G01R 33/38* (2006.01)
*G01R 33/385* (2006.01)

(52) U.S. Cl.
CPC ..... *G01R 33/3806* (2013.01); *G01R 33/3804* (2013.01); *G01R 33/385* (2013.01)

(58) Field of Classification Search
CPC ............ G01R 33/3806; G01R 33/3804; G01R 33/385; G01R 33/3858; G01R 33/3802; G01R 33/3815; A61B 5/055
See application file for complete search history.

(56) References Cited

U.S. PATENT DOCUMENTS

| | | | | | |
|---|---|---|---|---|---|
| 4,837,541 | A | * | 6/1989 | Pelc | G01R 33/3815 174/15.6 |
| 5,488,339 | A | * | 1/1996 | Havens | G01R 33/421 324/318 |
| 7,468,606 | B2 | * | 12/2008 | Eberlein | G01R 33/381 324/319 |
| 7,646,272 | B1 | * | 1/2010 | Schmierer | G01R 33/3815 335/216 |
| 7,692,426 | B2 | * | 4/2010 | Dietz | G01R 33/3815 324/318 |
| 7,821,268 | B2 | * | 10/2010 | Albrecht | G01R 33/28 324/318 |
| 7,852,629 | B2 | * | 12/2010 | Yu | G01R 33/3815 62/51.1 |
| 2013/0090002 | A1 | | 4/2013 | Dietz et al. | |
| 2018/0024210 | A1 | * | 1/2018 | Heid | G01R 33/3815 324/322 |

FOREIGN PATENT DOCUMENTS

| | | | | |
|---|---|---|---|---|
| DE | 102011084021 A1 | | 4/2013 | |
| GB | 2440350 A | * | 1/2008 | .............. F17C 3/085 |
| GB | 2487118 A | * | 7/2012 | ......... G01R 33/3804 |
| JP | 2009147247 A | | 7/2009 | |

* cited by examiner

*Primary Examiner* — Daniel R Miller
(74) *Attorney, Agent, or Firm* — Banner & Witcoff Ltd.

(57) ABSTRACT

A magnetic resonance device having a main magnet unit with a cylindrical patient aperture. A gradient connection plate for a gradient coil arrangement surrounds the patient aperture. A cladding arrangement with at least one cladding part outwardly delimits the main magnet unit.

15 Claims, 5 Drawing Sheets

MAGNETIC RESONANCE DEVICE

TECHNICAL FIELD

The subject matter of the disclosure relates to a magnetic resonance device having a main magnet unit with a cylindrical patient aperture. A gradient connection plate for a gradient coil arrangement surrounds the patient aperture. A cladding arrangement has at least one cladding part which outwardly delimits the main magnet unit.

BACKGROUND

Magnetic resonance devices of this type are also known as whole body systems, since a patient can be moved into the patient aperture in order ultimately to be able to receive any parts of the human body. On account of the requisite size of the patient aperture and the remaining components required for the imaging, whole body magnetic resonance devices have a size which often demands significant structural measures during installation. One important measured value here is the height of the main magnet unit, since doors often represent height-limiting elements during transportation through corridors in hospitals and/or radiology practices. Even if there is the option of removing doors, the problem frequently exists of concrete structures supported by way of doors not being able to be broken down for the transportation of the main magnet unit. The height of the main magnet unit is also relevant during transportation in heavy goods lifts, as may exist in larger clinical facilities. In this context, modern magnetic resonance devices frequently have a height which clearly exceeds two meters, so that by way of example walls have to be broken down, heavy load cranes have to be used and suchlike.

There exists here a plurality of properties of known magnetic resonance devices which provide for a significant height of the main magnet unit. For instance, it is necessary for main magnet coils, which are supported in liquid helium, to arrange the cold head above the maximum fill level of the helium. Gradient connection plates for receiving the high Lorentz forces on gradient coil cables and for damping vibrations, fastening structures for the crane transport, suspension structures of the superconducting main magnet coils and also cladding parts require a further increase in the vertical dimensions. To this end, an increase in the size of the main magnet unit, in particular the radius of the cylindrical main magnet unit, results in cost savings in respect of the superconducting wire and the weight, so that a reduction in the radius of the cylindrical main magnet arrangement by, for instance, 10 to 30 cm is not easily possible without significant costs.

SUMMARY

An object underlying the subject matter of the disclosure is therefore to simplify the transport of main magnet units of a whole-body magnetic resonance device within already existing buildings.

In order to achieve this object, with a magnetic resonance device of the type cited in the introduction, provision is made for The gradient connection plate on one side of the main magnet unit, in particular an end face, to be fastened between the vacuum vessel and the cladding arrangement, and The at least one buttress ring arranged centrally in particular in the longitudinal direction of the main magnet unit is embodied to be flatter in a top side region extending about the highest point of the vacuum vessel and/or floor region extending about the lowest point of the vacuum vessel than in a laterally adjoining region.

In accordance with the subject matter of the disclosure, it is therefore initially proposed to provide the gradient connection plate laterally on the main magnet arrangement and not, as previously customary in the prior art, on the top side. The gradient connection plate is used to receive the high Lorentz forces on the cables to the gradient coils of the gradient coil arrangement and to prevent vibrations from the connecting points between the supply line from the gradient amplifier and the cables to the gradient coils. The arrangement of the gradient connection plate relative to the main magnet field is therefore an important aspect, wherein examinations have shown that other locations besides the top side of the main magnet arrangement are also suited to usefully accommodating the gradient connection plate. For instance, it is possible to provide the gradient connection plate on an end face, in particular laterally adjacent to the patient aperture. Aspects are also conceivable, in which the gradient connection plate is to be provided on a longitudinal side of the vacuum vessel, for instance in a region provided readily for different electronic components.

With magnetic resonance devices, the support of the main magnet coils is typically realized by way of elastic suspension elements, in order to achieve an oscillation decoupling of the main magnet coils from the vacuum vessel, which is frequently also referred to as "Outer Vacuum Container"—OVC and to minimize the heat entry from the outside into the superconducting main magnet coils. The thus realized suspension twists the main magnet coils in the inside in a number of directions. The suspension elements are typically not attached, in particular welded, from the inside to the cylindrical vacuum vessel, but instead from the outside, and are instead covered or outwardly completed by cover elements of the buttress rings. The buttress rings enclose the magnets at least largely in the shape of a ring and are used for reinforcement, which represents an increase in the otherwise cylindrical surface. In accordance with the subject matter of the disclosure, it was now identified that the design of the buttress rings is decisive if a lower height of the main magnet unit is to be achieved. It is therefore proposed to flatten the buttress rings for the vacuum vessel both in the top side region (ceiling region) and also in the floor region about the highest or lowest point of the vacuum vessel, in order to provide a lower overall installation height.

This can be further improved particularly advantageously by further measures with respect to the suspension of the main magnet coils and the aspect of the buttress rings. In this context, a particularly advantageous development of the subject matter of the disclosure provides that the fastening regions are laterally offset, in particular by at least 15, preferably at least 20 cm, in the peripheral direction in particular symmetrically in pairs with respect to the vertical center plane of the vacuum vessel, with respect to the highest point of the vacuum vessel. This means that the position of the fastening regions and thus the suspension points is as far away as possible from the highest point of the vacuum vessel. In this context, it is also advantageous if, on account of the outward displacement of the fastening regions, the height of the cover elements in the fastening regions still only amounts at most to 0.4 to 5 cm above the highest point of the vacuum vessel, wherein an ideal aspect may even permit the cover elements to be lower than this highest point. Similarly, provision can also be made for the height of the at least one buttress ring in the top side region above the highest point and/or the floor region above the lowest point to amount at most to 0.4 to 5 cm. In this context, it should be noted that within the scope of the flattening in the top side region and/or floor region, it is largely conceivable to leave a hole in the reinforcing structure formed by the at least one buttress ring at the topmost or lowest point of the vacuum vessel, wherein the height of the buttress ring, adjoining the hole, increases outward in the top side region or floor region until the nominal height for the remaining regions, which can amount to 3 to 6 cm, is reached, for instance.

If in an advantageous aspect of the subject matter of the disclosure the outer diameter of the vacuum vessel now amounts to between 1.8 and 1.95 m, a clear height reduction and thus improved transportability of the main magnet unit, for instance in respect of doors or goods lifts is already possible with the previously mentioned measures. To this end, measures were already combined in different technical specialist fields, namely with respect to the suspension of the main magnet coils, the aspect of the reinforcement and the arrangement of the gradient connection plate. Nevertheless, the subject matter of the disclosure also proposes further measures, which likewise contribute to lowering the overall height of the main magnet unit and involves facilitating transportation.

Therefore, in an advantageous development of the subject matter of the disclosure, provision can be made for at least one cladding part which covers the top side of the vacuum vessel and extends across at least most of the length of the main magnet unit, to be embodied to be removable in particular independently of further cladding parts which cover side regions. This means that cladding parts in the top region of the main magnet unit are designed so that they can be easily removed for transportation, for instance by providing corresponding, detachable fastening means. Easily removable in this context means that the at least one upper cladding part can be removed without to this end the (typically larger) cladding parts on the end faces (front side and rear side) and/or on the longitudinal sides having to be removed. This enables the height of the cladding part on the top side and its manufacture and/or assembly tolerances for the transportation height of the main magnet unit to play no role and only minimal costs (work time) developing as a result of removing the upper cladding part.

In this context, provision can moreover be made for the height of the removable cladding part above the vacuum vessel in a central region comprising the at least one buttress ring and the fastening regions to be higher than outside of the central region. In particular, provision can be made for the at least one removable cladding part to be raised on the top side exclusively in the region of the at least one buttress ring and the suspension points on the top of the main magnet arrangement compared with the otherwise cylindrical shape. Particularly advantageously, however, at least at the front end of the main magnet unit the height of the upper cladding part (and possibly further cladding parts) above the vacuum vessel can be lower than in the central region so that as small and optical an impression as possible can be conveyed to the observer from the front and increased flexibility occurs, for instance as a result of suitable tilting, even with the transportation with a fastened removable cladding part.

In an aspect of the subject matter of the disclosure, provision can further be made for the main magnet unit to further have at least one suspension apparatus fastened to the vacuum vessel and/or the at least one buttress ring for the transportation of at least the main magnet arrangement, which is laterally offset in particular by at least 15, preferably at least 20 cm, in the peripheral direction in particular symmetrically in pairs with respect to the vertical center plane of the vacuum vessel, with respect to the highest point of the vacuum vessel. Suspension apparatuses on the top side of at least the main magnet arrangement are already known from the prior art, in order, for instance, to attach hooks so that at least the main magnet arrangement can be suspended with a crane above its center of gravity and can be transported. Corresponding suspension apparatuses must be designed here to be correspondingly stiff and firm. In order here not to apply too significantly with respect to the maximum height of the main magnet unit, provision can also be made with respect to the suspension apparatuses for its position to be moved outwards as far as possible to the left and right, for instance outwardly adjacent to the cover elements and/or provided hereon.

In this context, provision can particularly advantageously further be made for the at least one suspension apparatus to have a section, in particular a loop, having an engagement opening for a hook, which can be hinged between an established, engagement-ready useful position at least substantially in the vertical direction and an applied rest position at least substantially in the peripheral direction. In other words, the engagement sections of the suspension apparatuses can be embodied to be foldable laterally downward, so that they only apply upward onto the height for the transportation with a crane, and not for transportation on the floor, for instance with rollers, and thus do not contribute overall to the transportation height.

A further particularly advantageous aspect of the subject matter of the disclosure can provide that at least one electronics unit and/or a component of a patient aperture ventilation device and/or at least one cable support is arranged in a side region of the main magnet unit positioned between the vacuum vessel and the cladding arrangement on at least one longitudinal side. Such a side region, which can be referred to as an E box for instance, and can offer a receiving space for electronics components, in particular electronics units, and further components, can involve for instance a corresponding expansion of a cladding part of the cladding arrangement there. Such a side region can also be expediently adjusted within the scope of the subject matter of the disclosure in order to allow for a lower transportation height and in this context also access height, for maintenance, for instance. The gradient connection plate can therefore expediently be fastened in the side region, if no fastening on an end face is desired. Furthermore, the arrangement of the components in the side region can be selected so that the upper end of the at least one electronics unit and/or the component of the patient aperture ventilation device and/or the at least one cable holder is at most 1.9 m, in particular at most 1.8 m above floor level. The components, which are attached laterally in a side region of the main magnet arrangement, including electronics units of the patient fan and the support for the cable in a height region can therefore be clearly below 2 m, preferably below 1.9 m, particularly preferably below 1.8 m.

Within the scope of the subject matter of the disclosure, it has moreover proven particularly expedient if the upper end of a cooling component, of a cooling apparatus, supporting a cold head, for the main magnet coil, in particular a turret, is arranged less than 1.8 m, in particular less than 1.5 m, above the floor level. The component of the cooling apparatus, supporting the cold head, for the main magnet coils is frequently referred to as "turret". In this cooling component, other cryogenics can also be received. It is now proposed to attach this cooling component clearly lower than was customary in the prior art, particularly so that a service height is provided which amounts at most to 2.2 m. In this way, the maximum height of the cooling component and of the cold head resting thereupon also incidentally reduces. Such a situation is in particular then clearly enabled if the cooling apparatus operates with a helium quantity of less than 100 liters, in particular less than 10 liters, preferably less than one liter, particularly preferably less than 0.1 liter. The magnetic resonance device can therefore be what is known as a low helium system or even a helium-free system, as are already proposed in the prior art. This provides for a lower fill level of the liquid helium, which in turn establishes lower positions of the cold head.

With the inventive magnetic resonance device, it is further expedient if the lowest point of the vacuum vessel (and thus of the main magnet arrangement) has a height above the floor level of 0.1 to 20 mm. In other words, the lowest point of the magnetic cylinder can be as close as possible to the floor. Ideally, the distance from the floor is 0.1 to 20 mm, so that it is only just ensured that the main magnet unit stands on its feet, provided herefor, for instance, on the end faces and/or on the at least one buttress ring and are not supported centrally with the main magnet arrangement. Therefore, a maximum radius is available for the main magnet coils.

In summary, it can therefore be said that the subject matter of the disclosure proposes a plurality of individual measures when designing the main magnet unit, which contribute overall to a significant height reduction of the main magnet unit, in particular for a transportation height of below 2 m, without significantly reducing the main magnet coil radius and thus increasing costs. Provision can in particular therefore be made for the highest point of the main magnet unit, in particular with a removed top side cladding part, to be less than 2 m above floor level. This is made possible as a result of the clever interaction of different technical disciplines. Because many technically different properties make contributions, for instance the mechanical design of the magnet reinforcement up to the position of electronics and cable support and the design of the cryogenics and the layout of the cladding parts.

In particular, a whole-body magnetic resonance system is firstly enabled with a transportation height of below 2 m, wherein the height below which the main magnet unit can be transported through obstacles, for instance doors, is understood to be the transportation height. Roller systems can be used here, which are driven by hand or by motor. Significantly increasing the costs of the system for instance to high costs of the superconducting wire with very small magnet radii was avoided here.

The magnetic resonance device can expediently have a basic magnetic field strength of less than 1 tesla, in particular less than 0.6 tesla. Low field strengths of this type overall allow for a compact, less complicated design of the magnetic resonance device and also the use of lower helium quantities, as was already presented above. This will also generally contribute to low transport dimensions, for instance involving lateral components.

BRIEF DESCRIPTION OF THE DRAWINGS

Further advantages and details of the subject matter of the disclosure become apparent from the exemplary aspects described below and on the basis of the drawing, in which.

DETAINED DESCRIPTION

FIGS. 1 to 6 show an aspect of a main magnet unit 1 of an inventive magnetic resonance device, which is suited to a transportation height of below 2 m. Here FIGS. 1 to 5 show the main magnet unit 1 without cladding arrangement, which is explained in more detail on the basis of FIG. 6.

The main magnet unit 1 initially comprises a main magnet arrangement, which contains at least one support structure supporting a main magnet coil and is outwardly delimited by a vacuum vessel 2 (Outer Vacuum Container—OVC).

Figure 4:
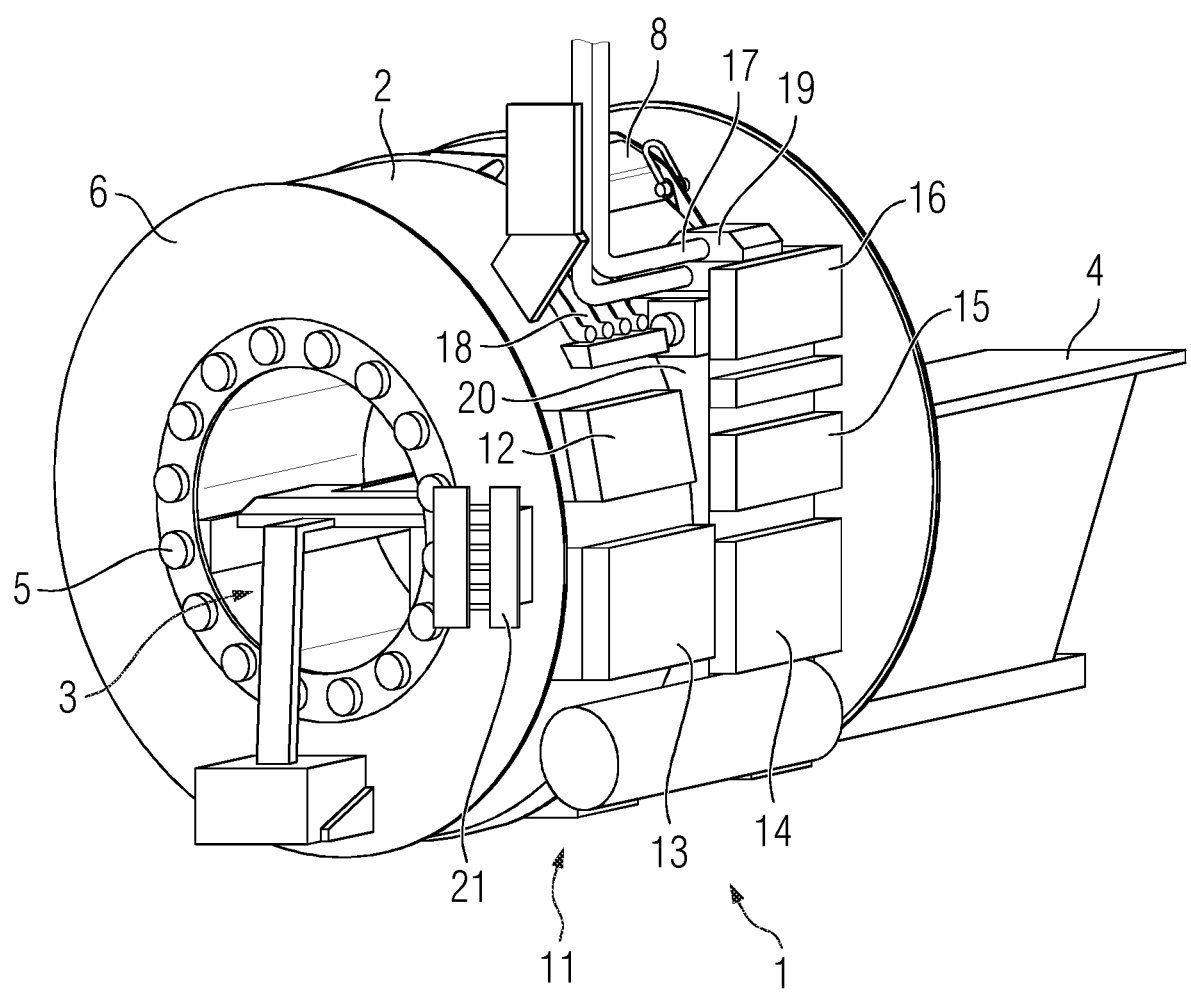
FIG. 4 shows a perspective rear view of the main magnet unit without cladding arrangement.

The vacuum vessel 2 is embodied to be substantially cylindrical and in its interior defines a cylindrical patient aperture 3, into which a patient can be moved for examination purposes by means of a patient couch 4 shown in FIG. 4. Coil arrangements 5 surrounding the patient aperture 3 are already used, in particular a high frequency coil arrangement and a gradient coil arrangement. The diameter of the patient aperture amounts to at least 55 cm, currently for instance 60 cm and at most for instance 75 cm. The outer diameter of the vacuum vessel 2 amounts to between 1.8 and 1.95 m.

Reinforcing structures are provided on the outside of the vacuum vessel 2, reinforcing discs 6 which currently do not or at least do not substantially project beyond the vacuum vessel 2, are currently on the end faces, and two buttress rings 7, which can be welded from the outside onto the vacuum vessel 2 for instance and can have breaks, are in a central region. The buttress rings 7 are connected on their top side by cover elements 8 associated herewith, which cover and stabilize the fastening regions and thus also fastening points for the suspension elements of the main magnet coils within the vacuum vessel 2.

Figure 1:
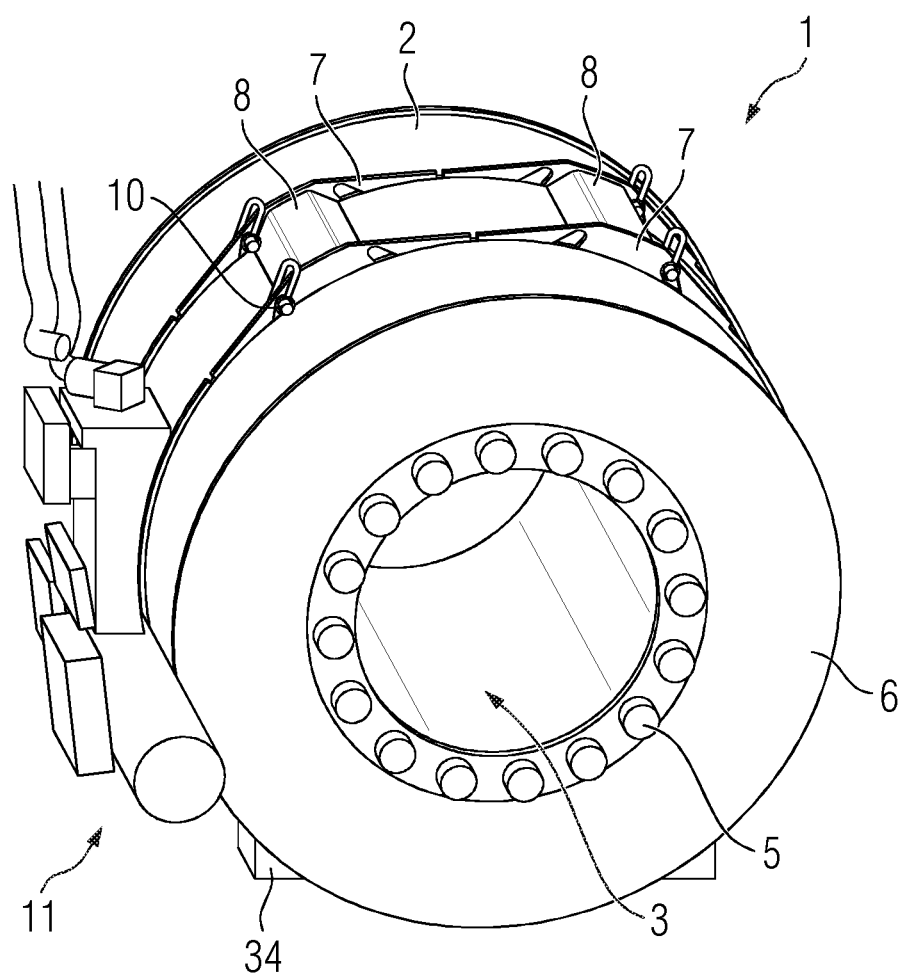
FIG. 1 shows a perspective view of a main magnet unit of an inventive magnetic resonance device without cladding arrangement from the front side.
Figure 2:
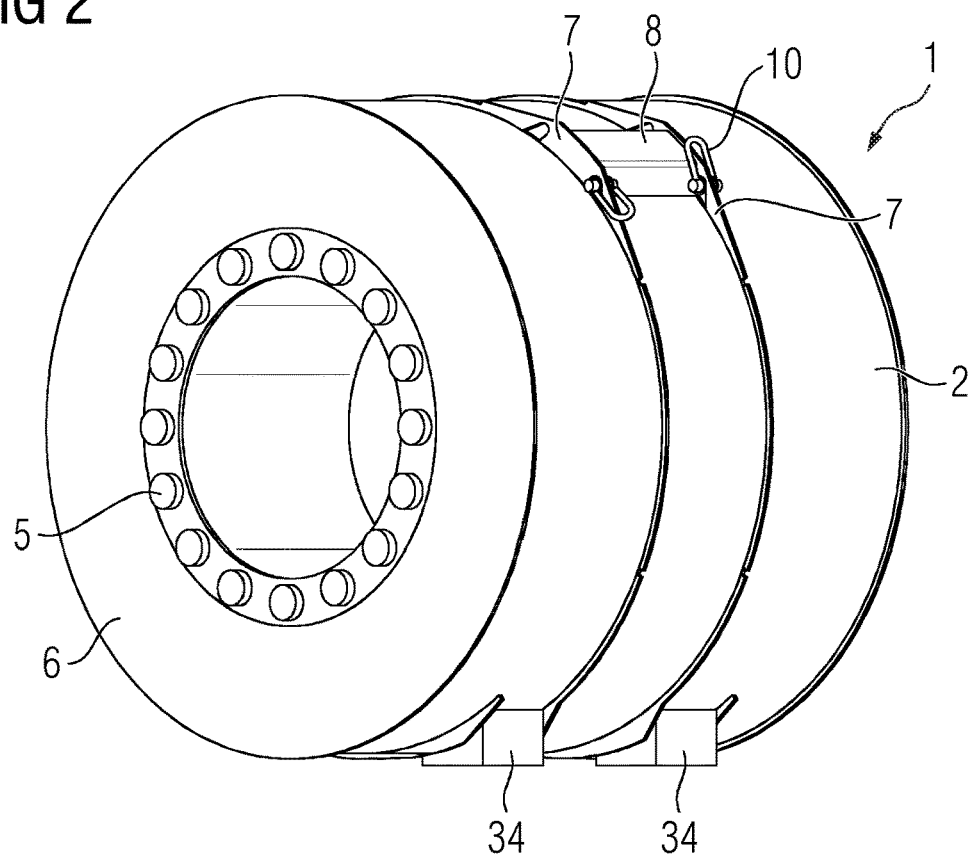
FIG. 2 shows a perspective view, corresponding to FIG. 1, of the front side and the opposing longitudinal side.
Figure 3:
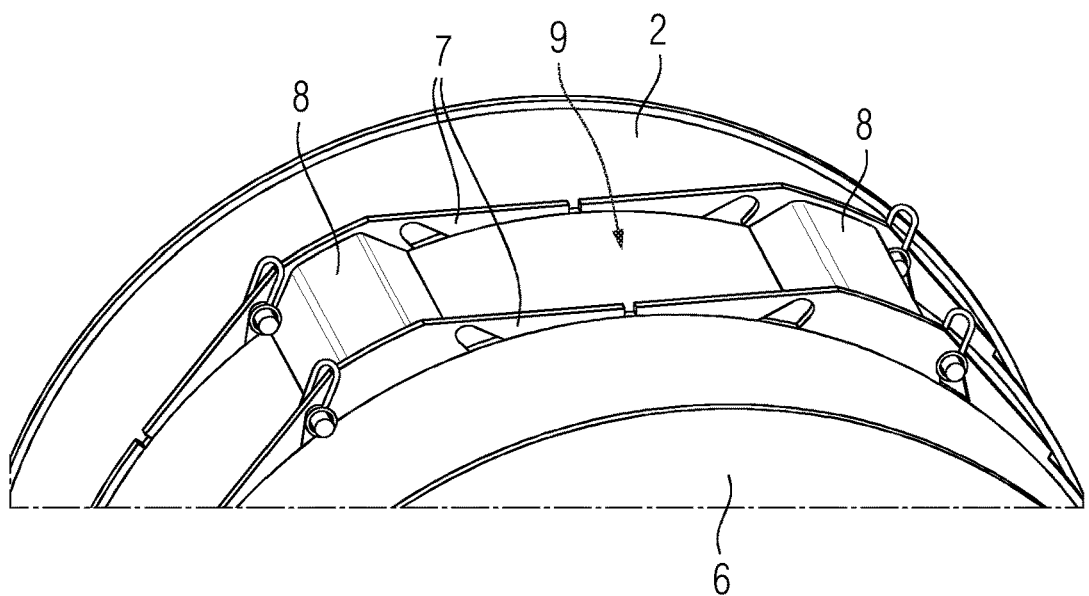
FIG. 3 shows a detailed view of the top side of the main magnet unit without cladding arrangement.

As can be seen in particular from FIG. 1 and FIG. 3, the fastening regions and thus the suspension points are displaced laterally outward, wherein two fastening regions are opposite one another symmetrically laterally offset with respect to the central vertical center plane of the vacuum vessel 2. The cover elements 8 therefore project very little, if at all, beyond the highest point of the vacuum vessel 2, for instance at most 0.4 to 5 cm. As also apparent in particular in FIG. 3, the buttress rings 7 are embodied so as to flatten in a top side region 9 which extends about the highest point of the vacuum vessel 2, so that starting from a gap present at the highest point, the height which forms only slowly, in particular a vertical course, increases to the maximum height in the region of the cover elements 8. This ensures that the buttress rings project at most 0.4 to 5 cm above the highest point of the vacuum vessel 2.

Suspension apparatuses 10 are also provided outwardly adjoining the cover elements 8, currently comprising a loop for engaging a hook for a crane transport of at least the main magnet arrangement. The loop is seemingly arranged in a hingeable manner on a base element as a section having an engagement opening for a hook, so that it can be moved between a substantially vertical useful position and an applied rest position. The loop can thus be folded into the rest position as a foldable section during the floor-bound transportation of the main magnet unit 1 and does not apply any additional height.

Four such suspension apparatuses 10 are currently provided, each of which is arranged symmetrically in pairs with respect to the vertical center plane of the vacuum vessel 2.

Figure 5:
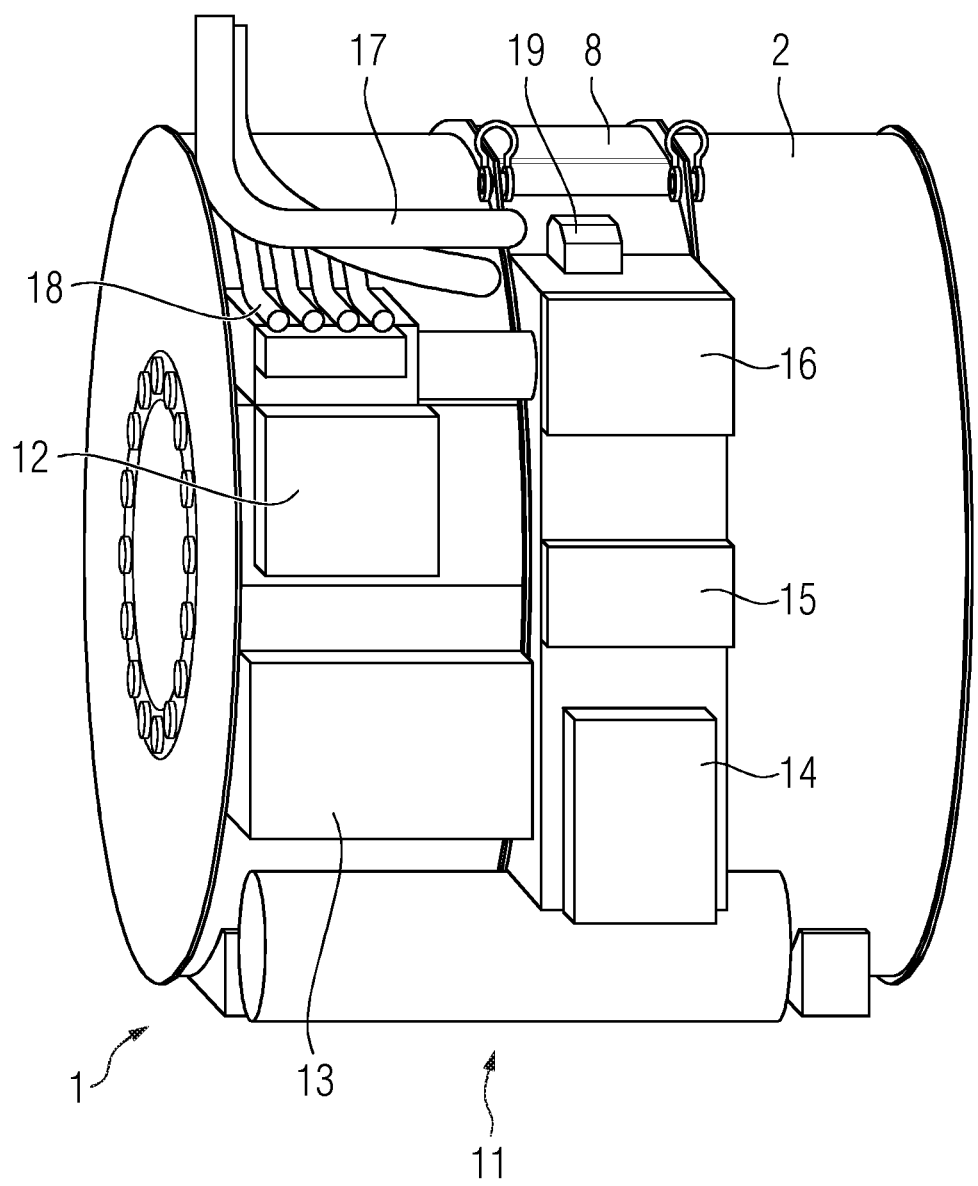
FIG. 5 shows a side view of the main magnet unit without cladding arrangement.

Further components of the main magnet unit 1 are fastened in a side region 11 positioned between the vacuum vessel 2 and the cladding arrangement on a longitudinal side, which are best viewed in FIGS. 4 and 5. A cooling component (20) (turret) with a cold head 19 is also located below these components in addition to an electronics unit 12 for the receiver electronics, an electronics unit 13 for the transmit electronics, an electronics unit 14 for the magnetic power supply, an electronics unit 15 for controlling light and temperature, an electronics unit 16 for monitoring the power up and power down, a cable holder 17 and a component 18 of a patient aperture ventilation device (patient fan). Since a cooling apparatus, which operates with less helium, for instance less than a liter of helium, is currently used, the cold head 19 can be arranged deep, for instance less than 1.5 m above floor level.

As is apparent, the upper end of none of the components 12 to 17 is higher than 1.8 m above the floor level.

It should be noted again at this point that overall the lowest point of the vacuum vessel 2 is also arranged very closely above the floor level, for instance at most 0.1 to 20 mm above the floor level. The vacuum vessel 2 is supported by feet 34 which can be seen in FIGS. 1 and 2, for instance.

As apparent from the display in FIG. 5, a gradient connection plate 21 of the gradient coil arrangement is fastened to the rear end face of the main magnet unit, instead of the previously usual fastening to the top side. It is also conceivable to locate the gradient connection plate 21 in the side region 11.

Figure 6:
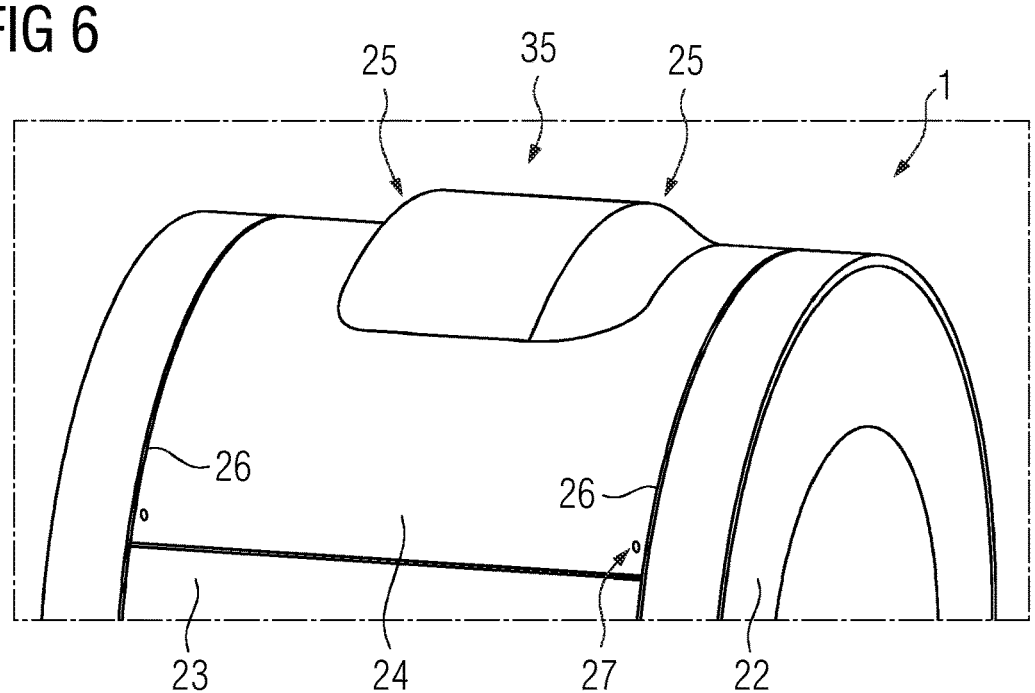
FIG. 6 shows a perspective view of the top side of the main magnet unit with cladding arrangement.

FIG. 6 shows an upper portion of the main magnet unit 1 with cladding parts 22, 23 and 24 of a cladding arrangement, which outwardly completes the main magnet unit 1. A top side cladding part 24 is clearly provided, which extends across most of the length of the main magnet unit 1 and is only embodied raised in the central region 35 comprising the buttress rings 7 and the cover elements 8, whereas a drop in height exists toward the end faces, as points 25 show. As the narrow gap regions 26 show, the cladding part 24 is designed to be removable, for instance by way of suitable fastening means 27. In this way the height for the transportation at least in the central region 35 can be significantly reduced again.

The magnetic resonance device with the main magnet unit 1 preferably sets low field strengths, for instance field strengths of less than or equal to 1 tesla, in particular less than or equal to 0.6 tesla.

Figure 7:
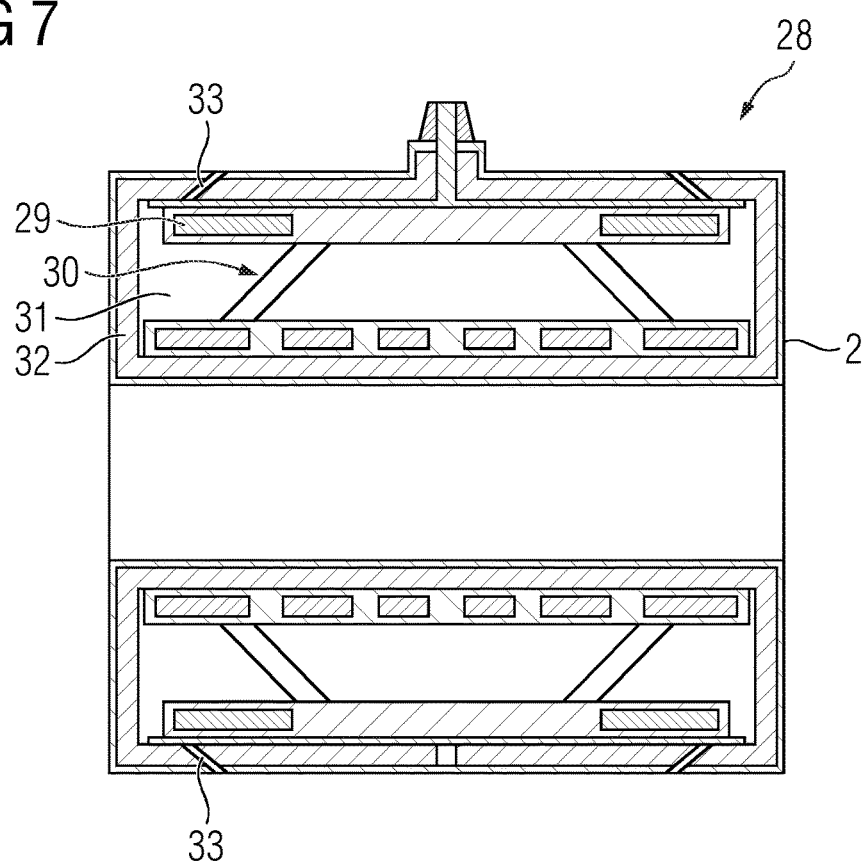
FIG. 7 shows a schematic cross-sectional view of a main magnet arrangement of the main magnet unit.

FIG. 7 shows a schematic representation of a possible inner structure of the main magnet arrangement 28. The main magnet coils 29 are supported by a support structure 30 within a helium vessel 31, which is surrounded by a temperature shield 32. Furthermore, the suspension elements 33 are indicated schematically. With a helium-free structure or structure operating with a very low quantity of helium, it is also possible to dispense with the helium vessel 31.

Although the subject matter of the disclosure has been illustrated and described in detail by the exemplary aspect, the subject matter of the disclosure is not restricted by the disclosed examples and other variations can be derived herefrom by the person skilled in the art without departing from the scope of protection of the subject matter of the disclosure.

The invention claimed is:

1. A magnetic resonance device having a main magnet unit with a cylindrical patient aperture with a diameter of at least 60 cm, wherein the main magnet unit comprises:
 a cylindrical main magnet arrangement, which is outwardly delimited by a vacuum vessel, in which a support structure supporting main magnet coils is supported by suspension elements which are fastened externally on the vacuum vessel in fastening regions;
 at least one buttress ring which is guided at least partially about the vacuum vessel, is fastened hereto and covers the fastening regions by cover elements;
 a gradient connection plate for a gradient coil arrangement that surrounds the cylindrical patient aperture; and
 a cladding arrangement with at least one cladding part outwardly delimits the main magnet unit,
 wherein the gradient connection plate is fastened on an end face of the main magnet unit between the vacuum vessel and the cladding arrangement, and
 wherein the at least one buttress ring arranged centrally in a longitudinal direction of the main magnet unit is flatter in a top side region which extends about a highest point of the vacuum vessel and/or a floor region which extends about a lowest point of the vacuum vessel than in a laterally adjoining region.

2. The magnetic resonance device of claim 1, wherein the fastening regions are laterally offset by at least 20 cm in a peripheral direction, symmetrically in pairs with respect to a vertical center plane of the vacuum vessel, with respect to the highest point of the vacuum vessel.

3. The magnetic resonance device of claim 2, wherein a height of the fastening regions above a surface of the vacuum vessel and/or a height of the at least one buttress ring in the top side region above the highest point of the vacuum vessel and/or the floor region above a lowest point is at most 5 cm.

4. The magnetic resonance device of claim 1, wherein an external diameter of the vacuum vessel is between 1.8 and 1.95 m.

5. The magnetic resonance device of claim 1, wherein at least the at least one cladding part which covers a top side of the vacuum vessel, and extends over at least most of a length of the main magnet unit, is removable irrespective of further cladding parts which cover lateral regions.

6. The magnetic resonance device of claim 5, wherein a height of the removable cladding part above the vacuum vessel in a central region comprising the at least one buttress ring and the fastening regions is higher than outside of the central region.

7. The magnetic resonance device of claim 1, wherein the main magnet unit has at least one suspension apparatus fastened to the vacuum vessel and/or the at least one buttress ring for transportation of at least the cylindrical main magnet arrangement, which is laterally offset by at least 20 cm in a peripheral direction, symmetrically in pairs with respect to a vertical center plane of the vacuum vessel, with respect to the highest point of the vacuum vessel.

8. The magnetic resonance device of claim 7, wherein the at least one suspension apparatus has a section having an engagement opening for a loop, which can be hinged between an established, engagement-ready useful position at least substantially in a vertical direction and an applied rest position at least substantially in a peripheral direction.

9. The magnetic resonance device of claim 1, further comprising:
   at least one electronics unit and/or a component of a patient aperture ventilation device and/or at least one cable holder arranged in a side region of the main magnet unit positioned between the vacuum vessel and the cladding arrangement on at least one longitudinal side.

10. The magnetic resonance device of claim 9, wherein an upper end of the at least one electronics unit and/or the component of the patient aperture ventilation device and/or is at most 1.9 m above the floor level.

11. The magnetic resonance device of claim 1, further comprising:
   a turret, which has an upper end supporting a cold head of a cooling apparatus for the main magnet coils, arranged less than 1.8 m above floor level.

12. The magnetic resonance device of claim 11, wherein the cooling apparatus operates with a quantity of helium of less than 100 liters.

13. The magnetic resonance device of claim 1, wherein the lowest point of the vacuum vessel has a height above a floor level of 0.1 to 20 mm.

14. The magnetic resonance device of claim 1, wherein a highest point of the main magnet unit with a removed top side cladding part is less than 2 m above a floor level.

15. The magnetic resonance device of claim 1, wherein the magnetic resonance device has a basic magnetic field strength of less than 1 T.

\* \* \* \* \*